United States Patent
Pinkerton

(10) Patent No.: US 9,467,073 B2
(45) Date of Patent: Oct. 11, 2016

(54) PIEZOELECTRIC ENERGY CONVERSION ASSEMBLIES

(75) Inventor: Joseph F. Pinkerton, Austin, TX (US)

(73) Assignee: Clean Energy Labs, LLC, Austin, TX (US)

( * ) Notice: Subject to any disclaimer, the term of this patent is extended or adjusted under 35 U.S.C. 154(b) by 386 days.

(21) Appl. No.: 13/512,680

(22) PCT Filed: Nov. 30, 2010

(86) PCT No.: PCT/US2010/058326
§ 371 (c)(1),
(2), (4) Date: May 30, 2012

(87) PCT Pub. No.: WO2011/066535
PCT Pub. Date: Jun. 3, 2011

(65) Prior Publication Data
US 2012/0235541 A1    Sep. 20, 2012

Related U.S. Application Data

(60) Provisional application No. 61/265,145, filed on Nov. 30, 2009.

(51) Int. Cl.
*H02N 2/18*    (2006.01)
*H01L 41/113*   (2006.01)
*H01L 41/31*    (2013.01)

(52) U.S. Cl.
CPC ............. *H02N 2/18* (2013.01); *H01L 41/1136* (2013.01); *H01L 41/31* (2013.01); *Y10T 29/42* (2015.01)

(58) Field of Classification Search
CPC ..... H02N 2/18; F23Q 3/002; H01L 41/1136; G01L 23/10; G01L 1/16
USPC .................................. 310/339, 338
See application file for complete search history.

(56) References Cited

U.S. PATENT DOCUMENTS

| 7,148,579 B2 | 12/2006 | Pinkerton et al. |
| 7,486,000 B1 | 2/2009 | Hacsi |

(Continued)

FOREIGN PATENT DOCUMENTS

WO    WO 2011066535 A1    6/2011

OTHER PUBLICATIONS

Patent Cooperation Treaty, PCT International Search Report; Issued in Connection with International Application No. PCT/US10/58326; Jan. 24, 2011; 3 pages; U.S.A.

(Continued)

*Primary Examiner* — Shawki S Ismail
*Assistant Examiner* — Bryan Gordon
(74) *Attorney, Agent, or Firm* — Dickinson Wright PLLC; Ross Spencer Garsson

(57) ABSTRACT

The present invention relates to piezoelectric energy conversion assemblies. The assembly includes a piezoelectric nanowire (such as a ZnO nanowire), an electrically conductive nanofilament (such as a carbon nanotube), a first electrically conductive element (such as a first metallic trace), and a second electrically conductive element (such as a second metallic trace). The first electrically conductive element is electrically connected to the piezoelectric nanowire, and the second electrically conductive element is electrically connected to the electrically conductive nanofilament. The piezoelectric nanowire and electrically conductive nanofilament are operable to contact one another such that a charge can flow from the first electrically conductive element, through the piezoelectric nanowire and the electrically conductive nanofilament, to the second electrically conductive element. Generally, the piezoelectric nanowire and/or electrically conductive nanofilament are cantilevered to allow them to contact one another. Assemblies can be arranged in series or in parallel.

25 Claims, 4 Drawing Sheets

(56) References Cited

U.S. PATENT DOCUMENTS

| | | | |
|---|---|---|---|
| 2006/0014202 A1* | 1/2006 | Watanabe et al. | 435/6 |
| 2006/0017353 A1* | 1/2006 | Sakai | 310/339 |
| 2008/0067618 A1* | 3/2008 | Wang | B82Y 10/00 257/415 |
| 2008/0095694 A1* | 4/2008 | Nakayama et al. | 423/445 B |
| 2008/0251865 A1* | 10/2008 | Pinkerton | B81B 3/0021 257/414 |
| 2009/0066195 A1 | 3/2009 | Wang et al. | |
| 2009/0160920 A1* | 6/2009 | Badesha et al. | 347/88 |
| 2009/0309456 A1* | 12/2009 | Stollberg | H01L 41/1136 310/319 |
| 2010/0253184 A1* | 10/2010 | Choi | H02N 2/18 310/339 |

OTHER PUBLICATIONS

Gao, Yifan, Equilibrium Potential of Free Charge Carriers in a Bent Piezoelectric Semiconductive Nanowire; Nano Letters; Feb. 3, 2009; pp. 1103-1110; vol. 9, No. 3; American Chemical Society; Washington; U.S.A.

Wang, Zhaoyu, Voltage Generation from Indiidual BaTiO3 Nanowires Under Periodic Tensile Mechanical Load; Nano Letters; Apr. 5, 2007; pp. 2966-2969; vol. 7, No. 10; American Chemical Society; Washington; U.S.A.

* cited by examiner

PIEZOELECTRIC ENERGY CONVERSION ASSEMBLIES

CROSS-REFERENCE TO RELATED APPLICATIONS

This patent application is a §371 national stage patent application based on International Patent Application No. PCT/US10/58326, filed Nov. 30, 2010, entitled "PIEZOELECTRIC ENERGY CONVERSION ASSEMBLIES," which claims priority to U.S. Patent Application No. 61/265,145, filed on Nov. 30, 2009, which are both incorporated herein by reference in their entirety.

TECHNICAL FIELD

The present invention relates to piezoelectric energy conversion assemblies, i.e., assemblies that convert diurnal motion of piezoelectric elements into an electrical output.

BACKGROUND

Nanoelectromechanical systems utilizing nanometer-scale assemblies that convert thermal energy into another form of energy that can be used to perform useful work at a macroscopic level are described in U.S. Pat. No. 7,148,579 to Pinkerton et al. ("the '579 Patent," which is incorporated herein by reference in its entirety). Such systems can be used to produce useful quantities of electric or mechanical energy, heat or cool an external substance or propel an object in a controllable direction. The '579 Patent system included nanometer-scale beams that reduced the velocity of working substance molecules that collide with this nanometer-scale beam by converting some of the kinetic energy of a colliding molecule into kinetic energy of the nanometer-scale beam. For instance, FIGS. 24 and 25 of the '579 Patent illustrated piezoelectric generators parallel and in series for converting thermal motion into an electric output. However, the piezoelectric elements of the '579 Patent may be too large to experience thermal oscillations of sufficient magnitude to open and close a nearby electrical contact. Also, van der Waals forces may cause the free end of these elements to get stuck to its nearby electrical contact.

Piezoelectric nanowires, such as ZnO nanowires, are described in Gao et at, Nano Lett., 2009, 9(3), 1103-1110 ("Gao," which is incorporated herein by reference in its entirety). As taught in Gao, when a nanowire bends one way and produces positive charge, this charge may be milled by mobile electrons. When that nanowire bends the other way and produces negative charge, the mobile electrons do not screen, so the system produces a net negative voltage. This is in contrast to piezoelectric energy conversion devices that produce positive/negative charge in equal amounts for opposite deflections.

SUMMARY OF THE INVENTION

The present invention relates to piezoelectric energy conversion assemblies.

In general, in one aspect, the invention features a piezoelectric energy conversion assembly that includes a piezoelectric nanowire, an electrically conductive nanofilament, a first electrically conductive element, and a second electrically conductive element. The first electrically conductive element is electrically connected to the piezoelectric nanowire, and the second electrically conductive element is electrically connected to the electrically conductive nanofilament. The piezoelectric nanowire and electrically conductive nanofilament are operable to contact one another such that a charge can flow from the first electrically conductive element, through the piezoelectric nanowire and the electrically conductive nanofilament, to the second electrically conductive element.

In general, in another aspect, the invention features a method of making a piezoelectric energy conversion assembly that includes depositing a piezoelectric nanowire on a first electrically conductive element. The method further includes depositing an electrically conductive nanofilament on a second electrically conductive element. The method further includes positioning the piezoelectric nanowire and the electrically conductive nanofilament so that piezoelectric nanowire is operable to contact the electrically conductive nanofilament to allow a charge to flow from the first electrically conductive element, through the piezoelectric nanowire and the electrically conductive nanofilament, to the second electrically conductive element.

In general, in another aspect, the invention features a method of using a piezoelectric energy conversion assembly that includes generating a voltage across a first electrically conductive element and a second electrically conductive element. The first electrically conductive element is electrically connected to a piezoelectric nanowire, and the second electrically conductive element is electrically connected to an electrically conductive nanofilament. Furthermore, the piezoelectric nanowire and the electrically conductive nanofilament are operable to contact one another. The method further includes flowing a charge from the first electrically conductive element, through the piezoelectric nanowire and the electrically conductive nanofilament, to the second electrically conductive element.

Implementations of the invention can include one or more of the following features:

The piezoelectric nanowire can be a cantilevered piezoelectric nanowire.

The electrically conductive nanofilament can be a cantilevered electrically conductive nanofilament.

The piezoelectric nanowire can include zinc oxide.

The piezoelectric nanowire can be a zinc oxide nanowire.

The electrically conductive nanofilament can be a carbon nanotube.

The carbon nanotube can be a single-walled carbon nanotube or can be a multi-walled carbon nanotube.

The piezoelectric nanowire and the electrically conductive nanofilament can be positioned vertically from one another.

The piezoelectric nanowire and the electrically conductive nanofilament can be positioned horizontally from one another.

The first electrically conductive element and the second electrically conductive element can be on the same assembly.

The method of making the piezoelectric energy conversion assembly can include growing the piezoelectric nanowire on the assembly, growing the electrically conductive nanofilament on the assembly, or both.

The first electrically conductive element can be on a first assembly, and the second electrically conductive element can be on a second assembly.

The method of making the piezoelectric energy conversion assembly can include growing the piezoelectric nanowire on the first assembly, growing the electrically conductive nanofilament on the second assembly, or both. The piezoelectric nanowire can be grown on the first assembly within a first growth environment. The electrically conductive nanofilament can be grown on the second assembly within a second growth environment. Furthermore, the first growth environment and the second growth environment can be different growth environments.

The method of making the piezoelectric energy conversion assembly can include performing the positioning step after growing of the piezoelectric nanowire on the first assembly.

The method of making the piezoelectric energy conversion assembly can include performing the positioning step after growing of the electrically conductive nanofilament on the second assembly In general, in another aspect, the invention features a device that includes several piezoelectric energy conversion assemblies, wherein at least one of the piezoelectric energy conversion assemblies is the piezoelectric energy conversion assembly described above.

In general, in another aspect, the invention features a method to make a device that includes several piezoelectric energy conversion assemblies, wherein at least one of the piezoelectric energy conversion assemblies is a piezoelectric energy conversion assembly made as described above.

Implementations of the invention can include one or more of the following features:

The piezoelectric energy conversion assemblies of the device can be placed in parallel, in series, or a combination thereof.

The piezoelectric energy conversion assembly can be capable of producing at least about 300 µV DC when operated at a temperature of around 325 K. The piezoelectric energy conversion assembly can be capable of producing about 300-400 µV DC when operated at a temperature of around 325 K.

The piezoelectric energy conversion assembly can include a first electrically conductive element that can be a metallic trace or a non-metallic trace that is electrically conductive. The piezoelectric energy conversion assembly can include a second electrically conductive element that can be a metallic trace or a non-metallic trace that is electrically conductive. In one or both instances, the non-metallic trace can include graphene.

There has thus been outlined, rather broadly, the more important features of the invention in order that the detailed description thereof may be better understood, and in order that the present contribution to the art may be better appreciated. There are additional features of the invention that will be described hereinafter.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

DETAILED DESCRIPTION

Nanofilaments can function as nanomechanical resonators that oscillate at high frequencies with small vibration amplitudes. As used herein, "nanofilament" generally refers to nanoscale wires or tubes, such as SWNTs, zinc oxide nanowires, etc. For example, types of nanoscale wires include ZnO nanowires (as shown in Gao) $BaTiO_3$ nanowires (as shown in Wang et al., Nano Lett, 2007, 7(10), 2966-2969, which is incorporated herein by reference in its entirety). Also, for example, types of nano tubes include single-walled carbon nanotubes (SWNTs). which have a high Young's modulus and low specific weight. Carbon nanotubes are a type of electrically conductive nanofilaments.

A nanofilament is modeled as a beam with a given length, radius, and Young's modulus, and mass and resonant frequency of the nanofilament can be calculated at a desired temperature (for example, room temperature). With an average number of nanofilaments per unit area, the average amplitude of thermal vibration due to heat alone or with electrical input can be calculated. Tip velocity due to heat and electrical input can also be calculated.

The free end of a cantilevered molecular-scale beam or nanofilament (for example, a carbon nanotube or zinc oxide nanowire) can oscillate with an amplitude approximately equal to its own diameter based on average thermal energy of the nanofilament at room temperature.

These thermal oscillations of the piezoelectric nanowires produce a voltage and there is no need to supply an external voltage. These oscillations (and associated voltage/current) are powered by heat. As a result, the increase of temperature of the piezoelectric nanowires will increase the magnitude of the oscillation/voltage (and current when the two terminals are connected across a load).

Figure 1:
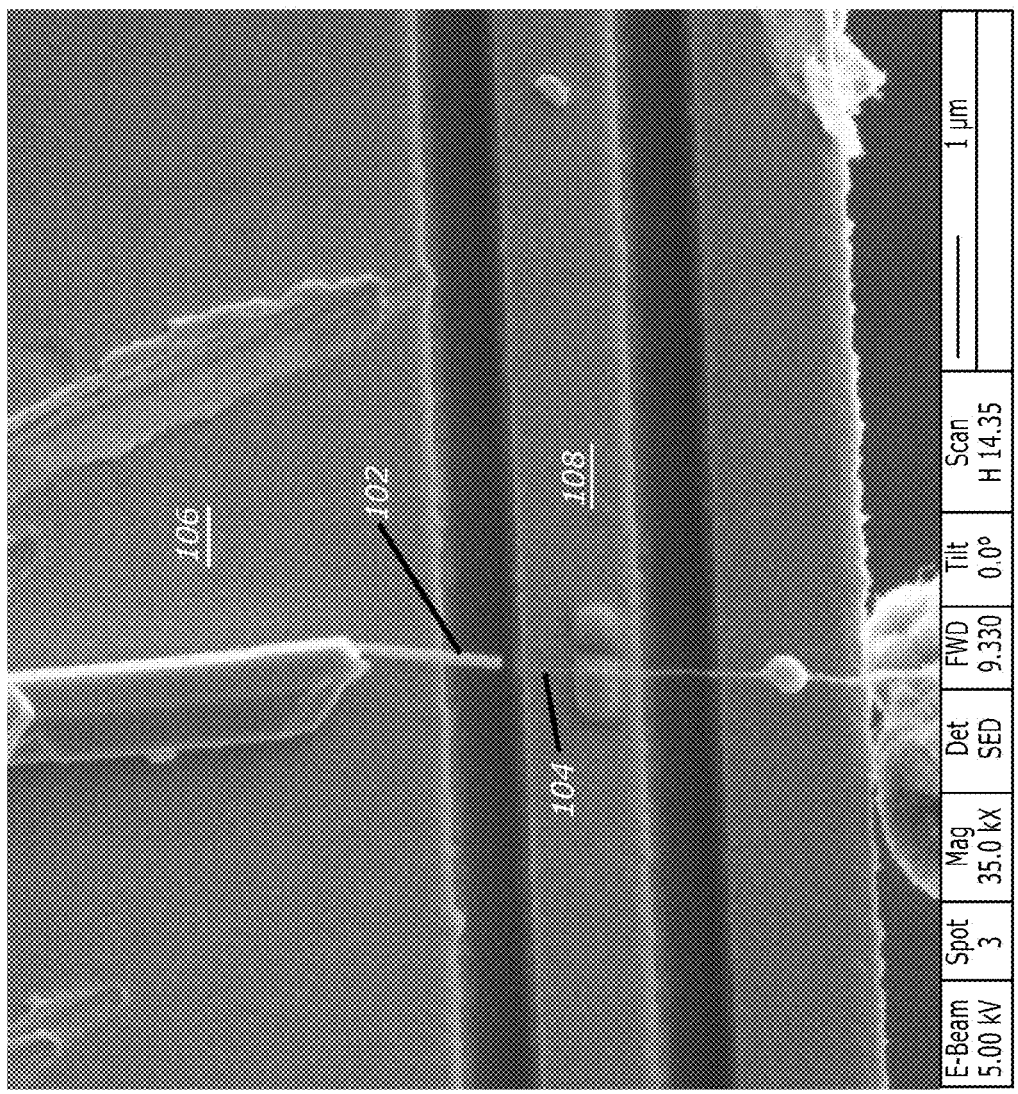
FIG. 1 is a scanning electron micrograph image of portion of a piezoelectric energy conversion assembly.

FIG. 1 is a scanning electron micrograph of a portion of piezoelectric energy conversion assembly 100, including cantilevered piezoelectric nanowire 102 (such as a zinc oxide nanowire) in contact with a cantilevered electrically conductive nanofilament 104 (such as a carbon nanotube). This assembly is capable of producing at least about 300 µV DC (and generally capable of producing about 300-400 µV DC) at temperatures near 325 K. In this embodiment, the piezoelectric nanowire free end vibrates at several MHz with heat. These oscillations create a strain in the piezoelectric nanowire 102 that in turn results in electric charge accumulating on the surface of the piezoelectric nanowire 102.

Attaching a small/light electrically conductive nanofilament (such as a carbon nanotube) to the piezoelectric nanowire tip allows the piezoelectric nanowire to still oscillate. since the electrically conductive nano-filament is much smaller/lighter than the piezoelectric nanowire. Since the electrically conductive nanofilament is electrically conductive and flexible, the piezoelectric nanowire charge flows from the fixed end of the piezoelectric nanowire metallic trace 106 to the fixed end of the electrically conductive nanofilament metallic trace 108, as evidenced by voltage measurements taken between the two metal traces shown in FIG. 1. Alternatively, other electrically conductive elements can be used in lieu of the metallic traces in this embodiment (such as nanowire metallic trace 106 and nanofilament metallic trace 108) and in the other embodiments disclosed herein. As used herein, "electrically conductive elements" include electrically conductive traces (such as metallic traces and non-metallic traces that are electrically conductive) and electrically conductive rods (such as metallic rods and non-metallic traces that are electrically conductive).

Figure 2:
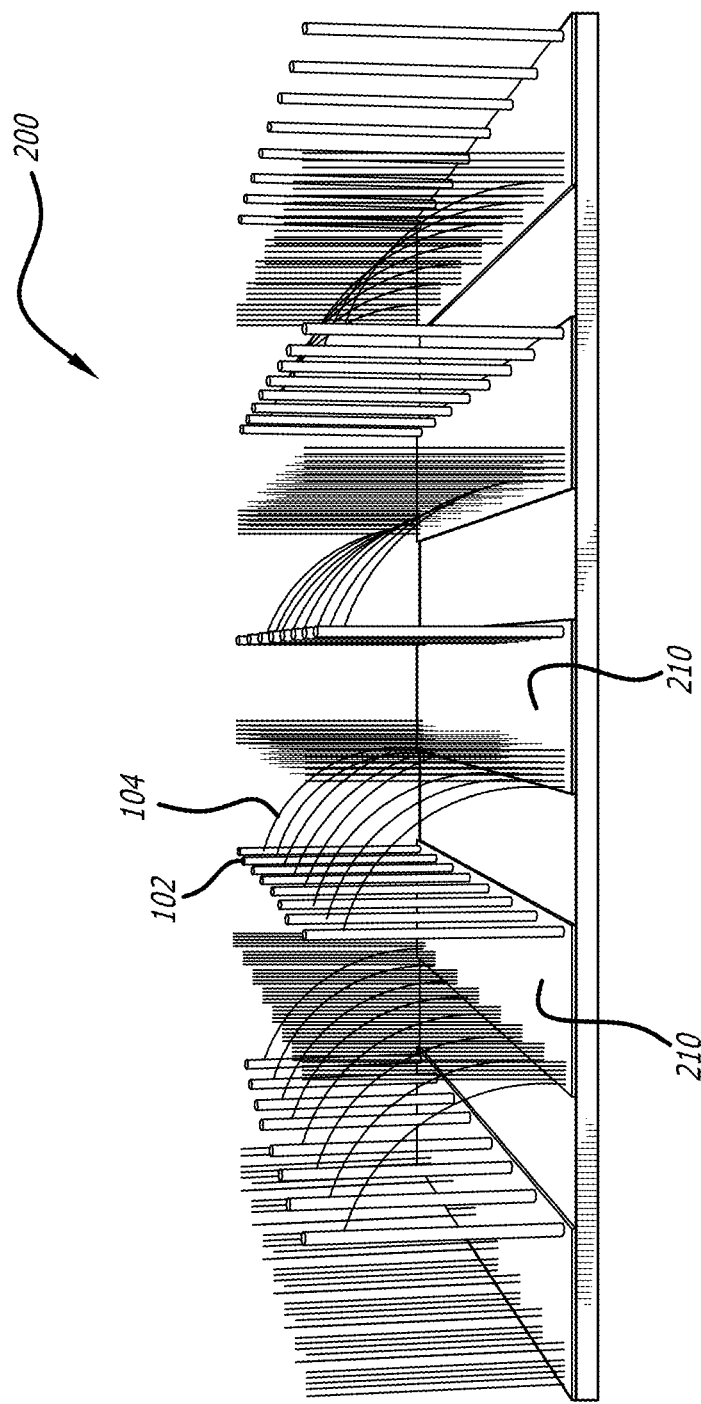
FIG. 2 illustrates a piezoelectric energy conversion assembly with vertical piezoelectric nanowires and electrically conductive nanofilaments (nanotubes).
Figure 3:
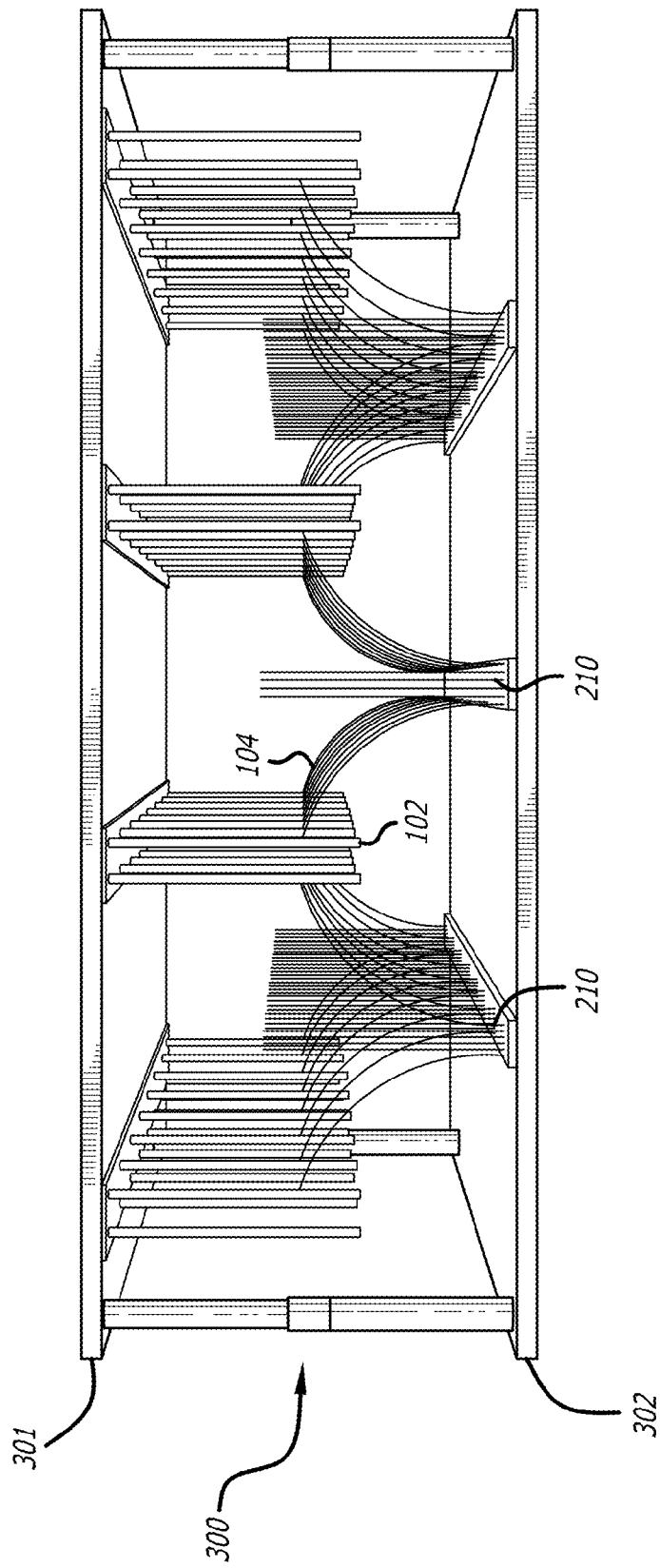
FIG. 3 illustrates is a second piezoelectric energy conversion assembly with vertical piezoelectric nanowires and electrically conductive nanofilaments (nanotubes).
Figure 4:
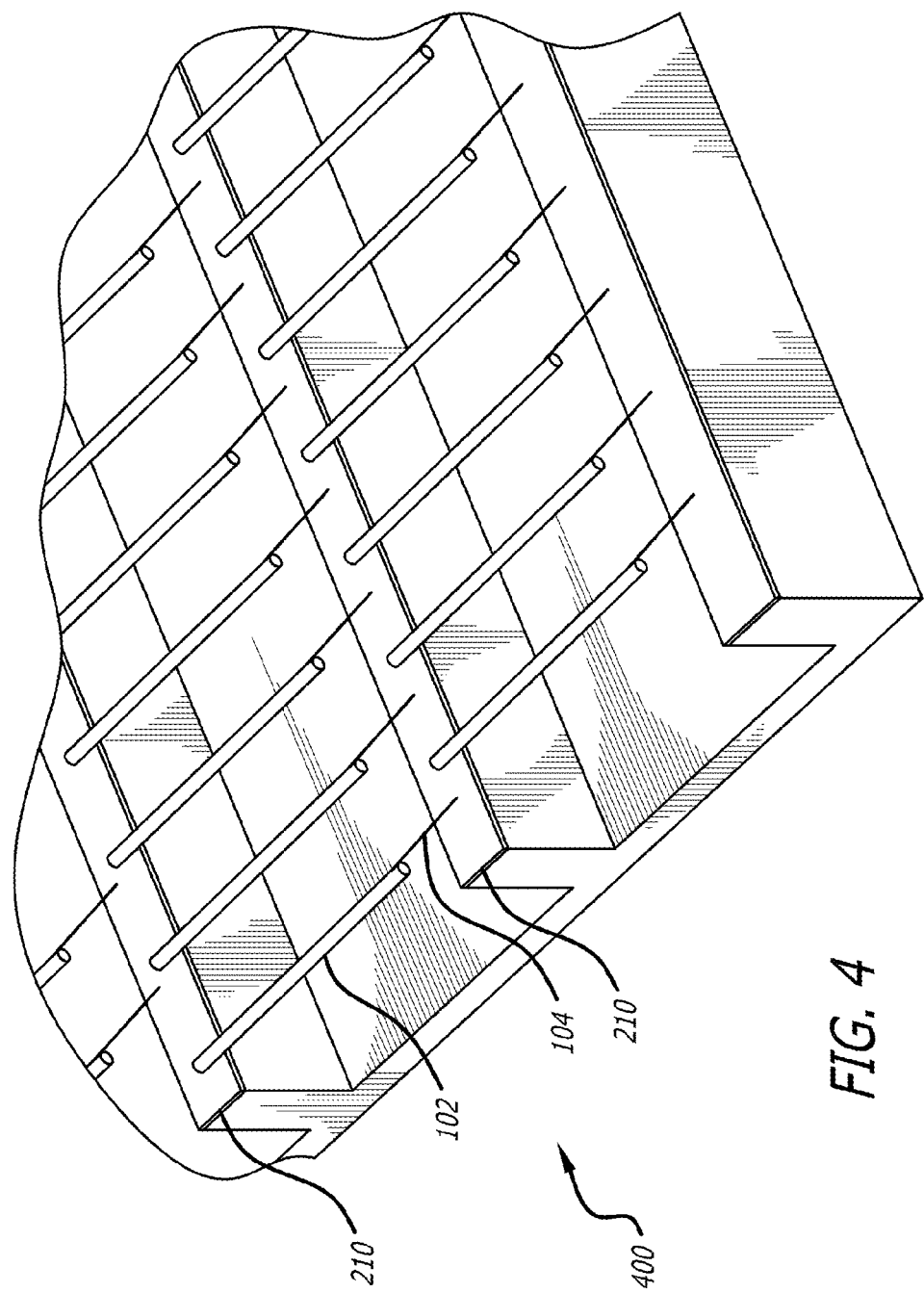
FIG. 4 illustrates a third piezoelectric energy conversion assembly with horizontal piezoelectric nanowires and electrically conductive nanofilaments (nanotubes).

FIGS. 2-4 show different ways the piezoelectric nanowire/electrically conductive nanofilament assemblies can be placed in series and parallel to produce higher voltages and current. The piezoelectric nanowires may be, for example, zinc oxide nanowires or BaTiO$_3$ nanowires. The electrically conductive nanofilament may be, for example, single-walled carbon nanotubes, multi-walled carbon nanotubes, or any combination thereof.

As shown in FIG. 2, vertical piezoelectric nanowires 102 and electrically conductive nanofilament 104 in piezoelectric energy conversion assembly 200 can be brought together by placing a voltage across two adjacent metallic traces 210. Once the piezoelectric nanowires and electrically conductive nanofilaments are in contact, van der Waals forces may act to keep the electrically conductive nanofilament in contact with (e.g., attached to) the tip of the piezoelectric nanowire.

FIG. 3 illustrates a piezoelectric energy conversion assembly 300 that operates like piezoelectric energy conversion assembly 200 but is constructed in a different manner. Benefits of this different construction are that the piezoelectric nanowire assembly 301 and electrically conductive nanofilament assembly 302 can be grown separately. The vertical piezoelectric nanowires 102 (such as ZnO nanowires) and the electrically conductive nanofilaments 104 (such as carbon nanotubes) generally prefer different growth environments. After growth of the piezoelectric nanowires 102 on the piezoelectric nanowire assembly 301 and the growth of the electrically conductive nanofilaments 104 on the electrically conductive nanofilament assembly 302, these separate piezoelectric nanowire/electrically conductive nanofilament assemblies can be physically moved relative to each other during assembly to couple the piezoelectric nanowires to the electrically conductive nanofilaments (which are then held together by van der Waals forces).

FIG. 4 illustrates horizontal piezoelectric nanowires 102 in contact with electrically conductive nanofilaments 104 in piezoelectric energy conversion assembly 400. The piezoelectric nanowires 102 and electrically conductive nanofilaments 104 are fixed at one end to metallic traces 210. Alternatively, and as noted above, other electrically conductive elements can be utilized in place of metallic traces 210 (for instance, a non-metallic trace that is electrically conductive, such as a trace that includes a sheet of graphene).

A number of embodiments of the invention have been described. Nevertheless, it will be understood that various modifications may be made without departing from the spirit and scope of the invention. Accordingly, other embodiments are within the scope of the following claims.

While embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. For example, nanofilament piezoelectric energy conversion assemblies can be layered or stacked (for instance, vertically) to increase output. In some embodiments, a sheet with nanofilament piezoelectric energy conversion assemblies is rolled into a cylinder, and a gas is allowed to flow from a first end of the cylinder to a second end of the cylinder. Accordingly, other embodiments are within the scope of the following claims. The scope of protection is not limited by the description set out above, but is only limited by the claims which follow, that scope including all equivalents of the subject matter of the claims.

The disclosures of all patents, patent applications, and publications cited herein are hereby incorporated herein by reference in their entirety, to the extent that they provide exemplary, procedural, or other details supplementary to those set forth herein.

What is claimed is:

1. A piezoelectric energy conversion assembly system comprising:
    a source of thermal energy; and
    a piezoelectric energy conversion assembly positioned near the source of thermal energy, wherein the piezoelectric energy conversion assembly comprises
        (i) a piezoelectric nanowire;
        (ii) a first electrically conductive element electrically connected to the piezoelectric nanowire;
        (iii) an electrically conductive nanofilament, wherein the electrically conductive nanofilament is lighter and more flexible than the piezoelectric nanowire; and
        (iv) a second electrically conductive element electrically connected to the electrically conductive nanofilament, wherein the piezoelectric nanowire and electrically conductive nanofilament are operable to contact one another such that a charge can flow from the first electrically conductive element, through the piezoelectric nanowire and the electrically conductive nanofilament, to the second electrically conductive element,
    wherein the piezoelectric energy conversion assembly is operative to convert thermal energy from the source of thermal energy into electrical output.

2. A method of using a piezoelectric energy conversion assembly to convert thermal energy into electrical energy comprising:
    placing the piezoelectric energy conversion assembly near a source of thermal energy,
    (ii) generating a voltage across a first electrically conductive element and a second electrically conductive element, wherein,
        (a) the first electrically conductive element is electrically connected to a piezoelectric nanowire,
        (b) the second electrically conductive element is electrically connected to an electrically conductive nanofilament, wherein the electrically conductive nanofilament is lighter and more flexible than the piezoelectric nanowire,
        (c) the piezoelectric nanowire and the electrically conductive nanofilament are operable to contact one another,
        (d) the piezoelectric energy conversion assembly coverts thermal energy from the source of thermal energy into an electric output to generate the voltage; and
    (iii) flowing a charge from the first electrically conductive element, through the piezoelectric nanowire and the electrically conductive nanofilament, to the second electrically conductive element.

3. The piezoelectric energy conversion assembly system of claim 1, wherein the piezoelectric nanowire is a cantilevered piezoelectric nanowire.

4. The piezoelectric energy conversion assembly system of claim 1, wherein the electrically conductive nanofilament is a cantilevered electrically conductive nanofilament.

5. The piezoelectric energy conversion assembly system of claim 1, wherein the piezoelectric nanowire comprises zinc oxide.

6. The piezoelectric energy conversion assembly system of claim 5, wherein the piezoelectric nanowire is a zinc oxide nanowire.

7. The piezoelectric energy conversion assembly system claim 1, wherein the electrically conductive nanofilament is a carbon nanotube.

8. The piezoelectric energy conversion assembly system of claim 7, wherein the carbon nanotube is selected from the group consisting of a single-walled carbon nanotube and a multi-walled carbon nanotube.

9. The piezoelectric energy conversion assembly system of claim 1, wherein the piezoelectric nanowire and the electrically conductive nanofilament are positioned vertically from one another.

10. The piezoelectric energy conversion assembly system of claim 1, wherein the piezoelectric nanowire and the electrically conductive nanofilament are positioned horizontally from one another.

11. The piezoelectric energy conversion assembly system of claim 1, wherein the first electrically conductive element and the second electrically conductive element are on the same assembly.

12. The piezoelectric energy conversion assembly system of claim 1, wherein the first electrically conductive element is on a first assembly and the second electrically conductive element is on a second assembly.

13. A system comprising
 (a) source of thermal energy; and
 (b) a device positioned near the source of thermal energy, wherein the device comprises a plurality of piezoelectric energy conversion assemblies, wherein at least one piezoelectric energy conversion assembly of the plurality of piezoelectric energy conversion assemblies is a piezoelectric energy conversion assembly comprising:
  (i) a piezoelectric nanowire;
  (ii) a first electrically conductive element electrically connected to the piezoelectric nanowire;
  (iii) an electrically conductive nanofilament, wherein the electrically conductive nanofilament is lighter and more flexible than the piezoelectric nanowire; and
  (iv) a second electrically conductive element electrically connected to the electrically conductive nanofilament, wherein the piezoelectric nanowire and electrically conductive nanofilament are operable to contact one another such that a charge can flow from the first electrically conductive element, through the piezoelectric nanowire and the electrically conductive nanofilament, to the second electrically conductive element,
 wherein the piezoelectric energy conversion assembly is operative to convert thermal energy from the source of thermal energy into an electrical output.

14. The system of claim 13, wherein the plurality of piezoelectric energy conversion assemblies are placed in parallel.

15. The system of claim 13, wherein the plurality of piezoelectric energy conversion assemblies are placed in series.

16. The system of claim 13, wherein a first set of the plurality of piezoelectric energy conversion assemblies are placed in series and a second set of the plurality of piezoelectric energy conversion assemblies are placed in parallel.

17. The piezoelectric energy conversion assembly system of claim 1, wherein the piezoelectric energy conversion assembly is capable of producing at least about 300 µV DC when operated at a temperature of around 325 K.

18. The piezoelectric energy conversion assembly system of claim 17, wherein the piezoelectric energy conversion assembly is capable of producing between about 300 and about 400 µV DC when operated at a temperature of around 325 K.

19. The piezoelectric energy conversion assembly system of claim 1, wherein the first electrically conductive element comprises a first metallic trace.

20. The piezoelectric energy conversion assembly system of claim 1, wherein the first electrically conductive element comprises a first non-metallic trace that is electrically conductive.

21. The piezoelectric energy conversion assembly system of claim 20, wherein the first non-metallic trace comprises graphene.

22. The piezoelectric energy conversion assembly system of claim 1, wherein the second electrically conductive element comprises a second metallic trace.

23. The piezoelectric energy conversion assembly system of claim 1, wherein the second electrically conductive element comprises a second non-metallic trace that is electrically conductive.

24. The piezoelectric energy conversion assembly system of claim 23, wherein the second non-metallic trace comprises graphene.

25. The piezoelectric energy conversion assembly system of claim 1, wherein the first electrically conductive element and the second electrically conductive element are mounted to a rigid structure that prevents relative motion.

* * * * *